United States Patent
Kondo et al.

(10) Patent No.: US 9,405,193 B2
(45) Date of Patent: Aug. 2, 2016

(54) IMPRINT APPARATUS, IMPRINT METHOD AND ARTICLE MANUFACTURING METHOD

(71) Applicant: CANON KABUSHIKI KAISHA, Tokyo (JP)

(72) Inventors: Yousuke Kondo, Utsunomiya (JP); Toshinori Kobashi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/865,648

(22) Filed: Sep. 25, 2015

(65) Prior Publication Data

US 2016/0097975 A1    Apr. 7, 2016

(30) Foreign Application Priority Data

Oct. 3, 2014  (JP) ................................ 2014-205201

(51) Int. Cl.
*B29C 59/02* (2006.01)
*G03F 7/00* (2006.01)
*G03F 7/16* (2006.01)

(52) U.S. Cl.
CPC . *G03F 7/16* (2013.01); *B29C 59/02* (2013.01); *G03F 7/0002* (2013.01)

(58) Field of Classification Search
CPC ...................................................... G03F 7/0002
See application file for complete search history.

(56) References Cited

U.S. PATENT DOCUMENTS 5,565,034 A * 10/1996 Nanbu .............. H01L 21/67173
                                                         118/319
2006/0032437 A1    2/2006 McMackin et al.
2015/0165650 A1*  6/2015 Miyajima ............... B29C 33/72
                                                         264/39

FOREIGN PATENT DOCUMENTS

| JP | 2008509825 A | 4/2008 |
| JP | 2014041861 A | 3/2014 |
| WO | 2006017793 A2 | 2/2006 |

* cited by examiner

*Primary Examiner* — Joshua D Zimmerman
(74) *Attorney, Agent, or Firm* — Rossi, Kimms & McDowell LLP

(57) ABSTRACT

An imprint apparatus include: a substrate stage; a dispense unit; an irradiation unit; a receiving unit configured to receive an imprint material that is dummy dispensed from the dispense unit; and a controller configured to cause the dummy dispensed imprint material to be irradiated by an energy beam from the irradiation unit without bringing the dummy dispensed imprint material into contact with the mold.

16 Claims, 6 Drawing Sheets

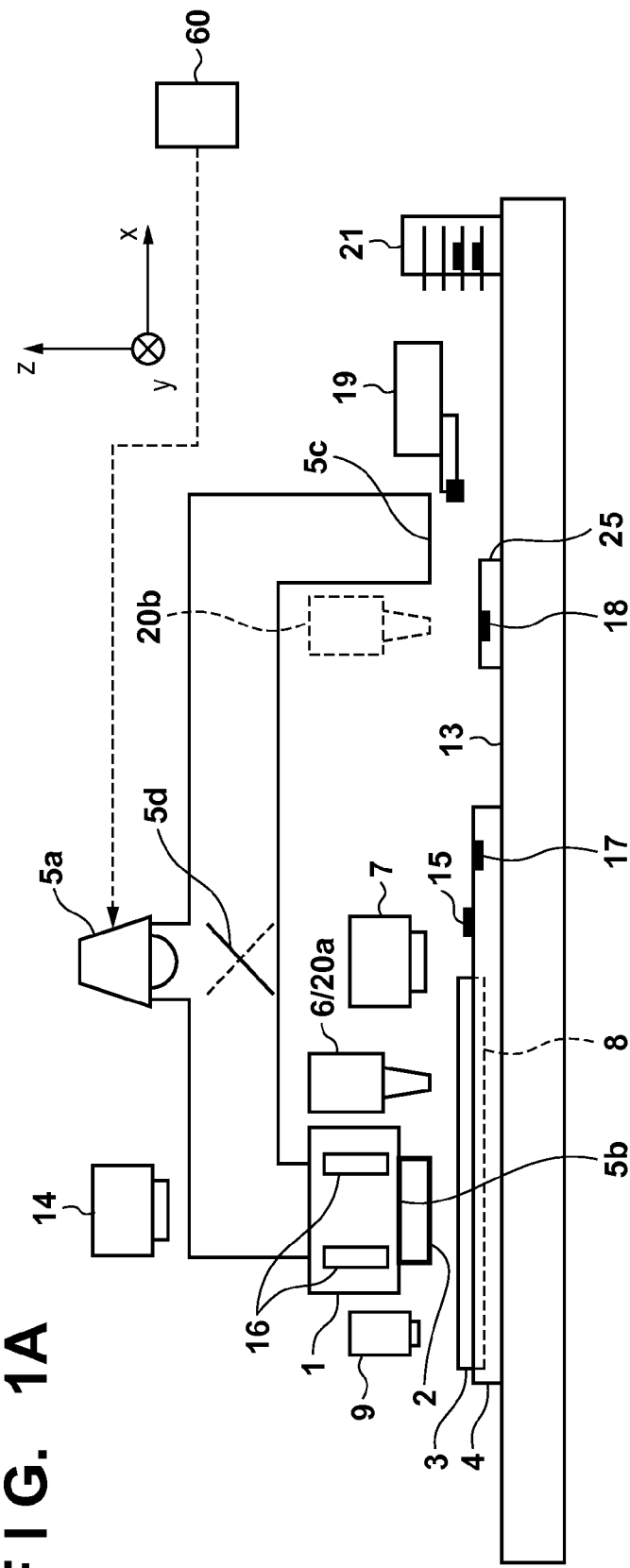
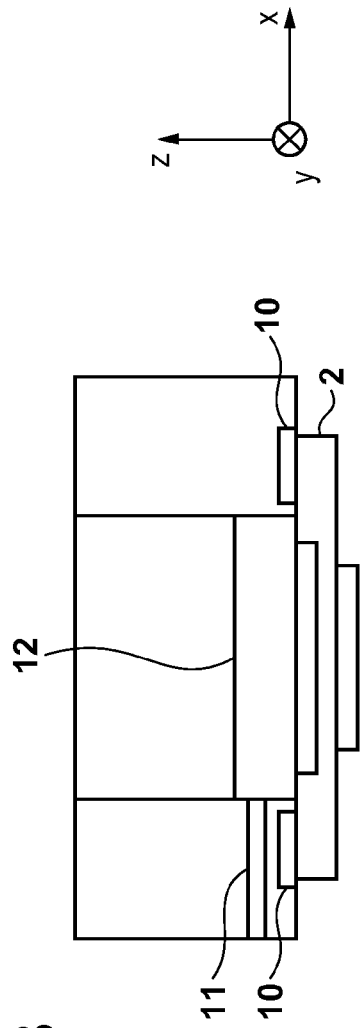

IMPRINT APPARATUS, IMPRINT METHOD AND ARTICLE MANUFACTURING METHOD

BACKGROUND OF THE INVENTION

1. Field of the Invention

The present invention relates to an imprint apparatus, an imprint method, and an article manufacturing method.

2. Description of the Related Art

An imprinting technique is a technique by which it is possible to transfer a fine pattern having a nanoscopic scale; it is in practical use as a lithography technique for volume production of a magnetic storage medium or a semiconductor device. In an imprinting technique, a fine pattern is formed on a substrate, such as a silicon wafer, a glass plate, or the like, by using a mold, in which the fine pattern is formed by using an apparatus such as an electron beam drawing apparatus. The fine pattern is formed by coating the top of the substrate with resin, and then, curing the resin in a state in which the resin is brought into contact with the pattern of the mold. For the resin coated onto the substrate, to enhance a filling property when the resin is brought into contact with the pattern, the resin is coated (supplied) onto the substrate as droplets of a few picolitres.

For example, in a resin coating scheme by an ink-jet method, in addition to resin dispensing for pattern forming on the substrate, it is necessary to perform dummy dispensing to prevent an ink-jet nozzle from clogging, and to maintain an ink-jet dispensing capability. Dummy dispensing is also called a preliminary dispensing or a flushing. However, if minute droplets in units of picolitres are left as are without curing, they are volatilized, and as a result volatile components adhere to a component in the imprint apparatus. For example, if a volatile component of the resin adheres to a substrate or a mask in the imprint apparatus, it becomes a cause for a pattern defect when forming the fine pattern.

Japanese Patent Laid-Open No. 2014-41861 proposes an imprint apparatus that provides an evacuating mechanism in proximity to an ink-jet, to evacuate to the outside the imprint apparatus a volatile component of a resin that occurs in the imprint apparatus.

In the method of providing the evacuating mechanism proposed in Japanese Patent Laid-Open No. 2014-41861, a problem still remains in that there is a possibility that a volatile component of a resin that is not fully evacuated will leak within the imprint apparatus, and a pattern defect will occur.

SUMMARY OF THE INVENTION

The present invention provides an imprint apparatus that prevents dummy dispensing of resin from adhering to a component in an apparatus.

The present invention in its first aspect provides an imprint apparatus for forming a pattern of an imprint material on a substrate by using a mold, the imprint apparatus comprising: a substrate stage configured to hold the substrate; a dispense unit configured to dispense the imprint material on the substrate; an irradiation unit configured to irradiate an energy beam that cures the imprint material; a receiving unit configured to receive an imprint material that is dummy dispensed from the dispense unit; and a controller configured to cause the dummy dispensed imprint material to be irradiated by an energy beam from the irradiation unit without bringing the dummy dispensed imprint material into contact with the mold.

The present invention in its second aspect provides an article manufacturing method using the imprint apparatus specified by the first aspect.

The present invention in its third aspect provides an imprint method of forming a pattern of an imprint material on a substrate by bringing the imprint material into contact with a mold, the imprint method comprising: dummy dispensing the imprint material onto a receiving unit different from the substrate on which the pattern is formed; forming the pattern of the imprint material on the substrate after the dummy dispensing; and curing the dummy dispensed imprint material without bringing the dummy dispensed imprint material into contact with the mold, before the pattern forming.

The present invention in its fourth aspect provides an imprint apparatus for forming a pattern of an imprint material on a substrate by using a mold, the imprint apparatus comprising: a dispense unit configured to dispense the imprint material on the substrate; a receiving unit different from the substrate on which a pattern is formed and configured to receive the imprint material dummy dispensed from the dispense unit; and a curing unit configured to cure the imprint material dispensed onto the receiving unit without bringing the imprint material dispensed onto the receiving unit into contact with the mold.

The present invention in its fifth aspect provides an imprint method of forming a pattern of an imprint material on a substrate by using a mold, the imprint method comprising: dummy dispensing the imprint material onto a receiving unit different from the substrate on which the pattern is formed; and curing the imprint material dummy dispensed onto the receiving unit.

Further features of the present invention will become apparent from the following description of exemplary embodiments with reference to the attached drawings.

BRIEF DESCRIPTION OF THE DRAWINGS

FIGS. 1A and 1B are views showing an imprint apparatus according to the present invention.

DESCRIPTION OF THE EMBODIMENTS

[Imprint Apparatus]

Figure 2A:
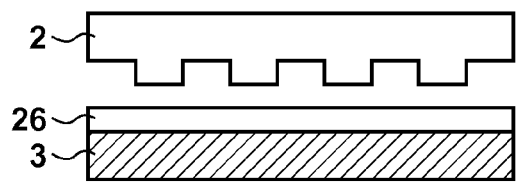
FIGS. 2A to 2F are views showing an imprint process.

FIG. 1A shows an embodiment according to the present invention of an imprint apparatus that forms a pattern on a substrate by bringing a resin on the substrate into contact with a mold. The imprint apparatus first holds a substrate 3 in a substrate holding unit 8 of a substrate stage 4. An off-axis alignment scope 7 detects a mark (not shown) that is provided on the substrate 3, and a substrate-stage-side mark 15, and obtains a position deviation amount and a shape deviation amount for the substrate stage 4 and the substrate 3. An on-axis alignment scope 16 detects a mold-side mark 36 and the substrate-stage-side mark 15, and obtains a position deviation amount and a shape deviation amount for the substrate stage 4 and a mold 2. A correction mechanism (not shown) corrects position deviation and shape deviation. For each shot, the imprint apparatus performs correction processing for the position deviation and the shape deviation, as well as an imprint process that forms a pattern, so as to form the pattern on a plurality of shot regions on the substrate 3. In the imprint process, a light-curing resin 26 is coated (dispensed) onto a target shot region by a coating unit (dispense unit) 6 from an ink-jet nozzle. Next, by driving an ink-jet head 1, which holds the mold 2, along a Z-axis, the resin 26 on the target shot region is brought into contact with a pattern of the mold 2, and the resin 26 fills the pattern. In this state an irradiation unit 5 irradiates an energy beam, which is ultraviolet light, or the like, to cure the resin 26 and to transfer the pattern onto the substrate 3. According to this embodiment, a light-curing resin is used as the resin 26. The light-curing resin is cured by irradiating light. Therefore, the irradiation unit 5 irradiates light to cure the light-curing resin. If an ultraviolet-curing resin is used for the resin 26, it is possible to use ultraviolet light as the energy beam. The energy beam is not limited to ultraviolet light, and can be appropriately determined according to the type of the resin 26.

The irradiation unit 5 includes a single energy beam source 5a, a first irradiation unit 5b, and a second irradiation unit 5c. The first irradiation unit 5b irradiates energy beams towards the substrate 3 held by the substrate stage 4. The second irradiation unit 5c irradiates energy beams towards a later explained second resin receiving unit 18. The switching mechanism 5d switches a path for energy beams generated by the energy beam source 5a between a path that guides to the first irradiation unit 5b and a path that guides to the second irradiation unit 5c.

The substrate holding unit 8 includes a substrate adhesion mechanism and a substrate holding chuck. The substrate holding chuck is comprised of one or a plurality of regions, and a substrate adhesion mechanism is configured on each region. A camera 14 can capture, from a side of a mold holding unit 10, a first pattern unit 31 for a mold in which a pattern is formed, to record the process in which the resin 26 fills between the mold 2 and the substrate 3. An image recorded by the camera 14 is stored in a memory unit (not shown). For measurement of the relative position between the mold-side mark 36 and substrate-side mark as well as between the mold-side mark 36 and the substrate-stage-side mark 15, a light position detector such as that disclosed in Japanese Patent Laid-Open No. 2008-509825 is used. In particular, a measurement method that uses a moire signal that is generated by both is useful because it is possible to achieve high measurement precision with a simple optical system. Because detection of the moire signal is possible without a high precision optical system, it is possible to employ a scope having low resolving power (small numerical aperture), and therefore it is possible to configure a plurality of scopes. Thereby, it is possible to configure a configuration that simultaneously measures marks at four corners of a shot, for example.

FIG. 1B shows an imprint head. The ink-jet head 1 holds the mold 2 by adhering to the mold 2 with the mold holding unit 10. A pressure control mechanism 11 is able to adjust the pressure of a mold back-side space that is enclosed by a seal glass 12 and the mold back-side. By using the pressure control mechanism 11 to locally increase the pressure of the mold back-side space to be greater than the pressure in the imprint apparatus, it is possible to deform a dent portion (cavity) of the mold 2 into a convex shape on a side opposite the chuck (the substrate side).

Figure 2D:
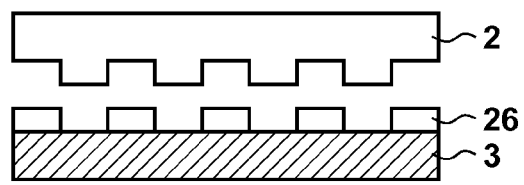
Figure 2B:
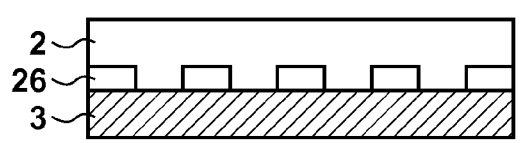
Figure 2E:
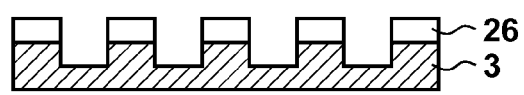
Figure 2C:
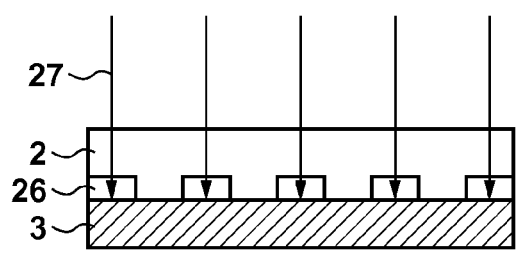
Figure 2F:
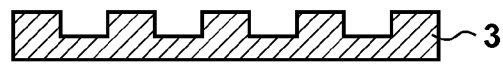

Using FIGS. 2A to 2F, explanation is given of an imprint process that transfers a pattern of the mold 2 to the substrate 3 to form a pattern on the substrate 3. Firstly, as shown on FIG. 2A, the resin 26 (imprint material) is coated onto the substrate 3 by the coating unit 6. Next, as shown on FIG. 2B, by bringing the mold 2 and the resin 26 on the substrate 3 close so as to bring the mold 2 into contact with the resin 26, the resin 26 fills the pattern of the mold 2. Next, as shown in FIG. 2C, irradiation with energy beams is performed to cure the resin 26. By widening an interval between the mold 2 and the substrate 3 after curing the resin 26, it is possible to separate the substrate 3 from the cured resin 26 (a releasing step). As shown in FIG. 2D, when the mold 2 is released, the pattern of the mold 2 is transferred to the resin 26. The processing of FIGS. 2A to 2D is performed in the imprint apparatus. Thereafter, as shown in FIG. 2E, an etching process is performed with the resin 26 as a mask, and as shown in FIG. 2F, when the resin 26 is removed, the pattern is formed in the substrate 3. The process of FIG. 2E is performed by an etching apparatus, and the process of FIG. 2F is performed by a resin separation apparatus.

Figure 3:
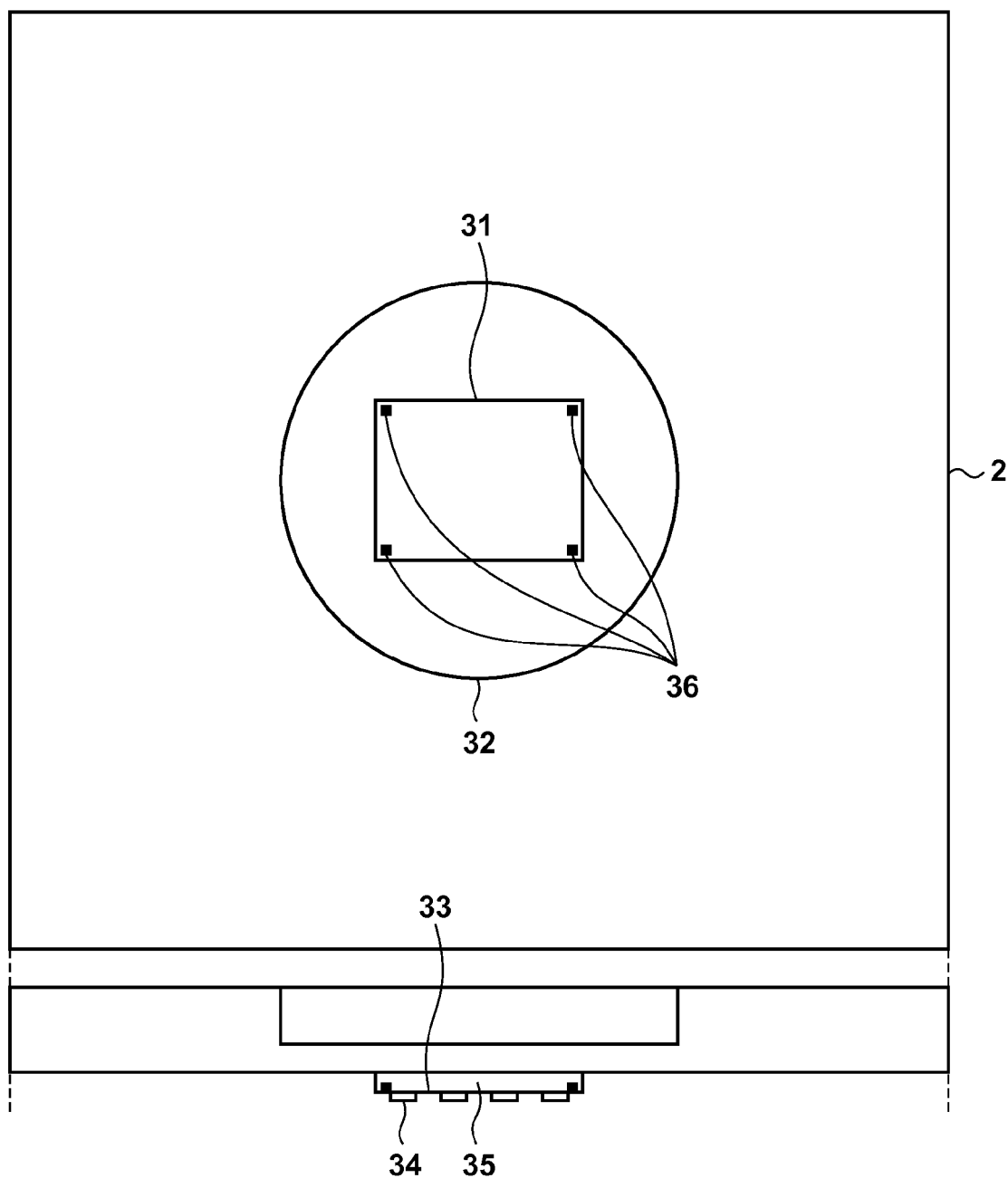
FIG. 3 is a view showing a mold.

FIG. 3 shows the mold 2. The mold 2 includes a fused quartz, an organic polymer, and a metal, but there is no requirement for a limitation to only these materials. The mold 2 has a dent portion 32 (cavity) engraved into a central portion thereof. For the thickness of the dent portion 32, around 1 mm is appropriate. A surface not having the dent portion 32 is called a first surface, and a surface having the dent portion 32 is called a second surface. The first pattern unit 31 is formed in the center of the dent portion 32 on the first surface. The first pattern unit 31 is comprised of a first pattern base unit 35 and the pattern, and the first pattern base unit 35 is configured with a thickness of about 30 μm. If a pattern used for manufacturing is formed in the first pattern unit 31, there are cases in which in a minute pattern, for example, a pattern of a few nanometers or a few tens of nanometers is formed. In such a case, a pattern depth from a first pattern convex portion 34 to a first pattern concave portion 33 is configured at several tens of nanometers to several hundred nanometers or so. The first pattern base unit 35 is equipped with the mold-side mark 36 that is used by the on-axis alignment scope 16.

The coating unit 6 includes a driving unit capable of translational and rotational drive with respect to the x, y, z axes in FIG. 1A, a nozzle unit, and a resin supply unit for supplying the resin 26 to the nozzle unit. By driving the nozzle unit along the x-axis by using the driving unit, the coating unit 6 can be moved between a first position 20a at which it is possible to dispense the resin 26 onto the substrate 3, and a second position 20b, which is outside of a movable range of the substrate stage 4 and at which it is possible to perform dummy dispensing of the resin 26 into the second resin receiving unit 18 The nozzle unit of the coating unit 6 is configured from several thousand dispensing holes or so that are for dispensing the resin 26. In addition to resin dispensing for pattern forming on the substrate 3, it is necessary for the nozzle unit of the coating unit 6 to perform dummy dispensing to prevent clogging of the nozzle unit of the ink-jet and to maintain an ink-jet dispensing capability. Dummy dispensing is also called a preliminary dispensing or a flushing.

Figure 4:
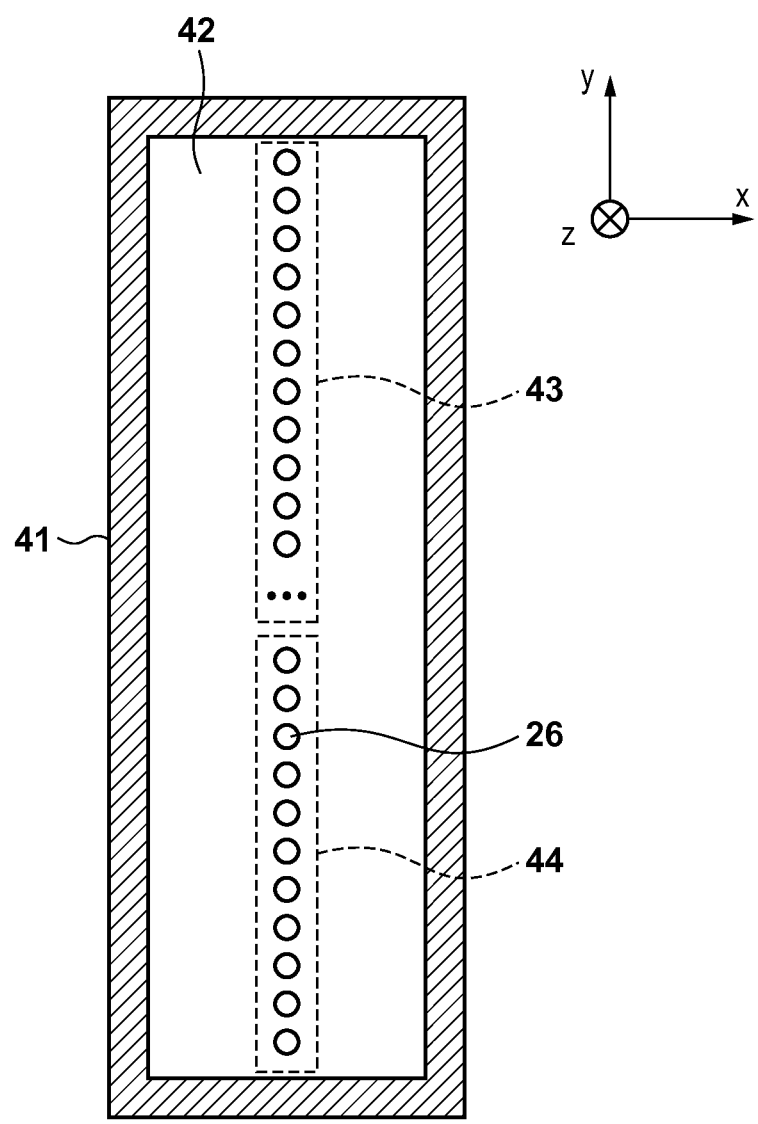
FIG. 4 is a view showing a resin receiving unit.

A first resin receiving unit 17 and the second resin receiving unit 18 are receptacles for receiving the resin 26 that is dummy dispensed. FIG. 4 shows either the first resin receiving unit 17 or the second resin receiving unit 18, from the perspective of the z-axis of FIG. 1A. The first resin receiving unit 17 or the second resin receiving unit 18 include a concave portion 42 that is depressed approximately 1 mm from a top surface 41, and dummy dispensing is executed with respect to the concave portion 42. If the concave portion 42 is material that does not deteriorate due to a resinous component, there is no particular restriction on the material of the concave portion 42. The first resin receiving unit 17 is configured on the substrate stage 4 at a position different to that at which the substrate 3 is held, and the substrate stage 4 has a resin receiving unit holding mechanism (not shown) for the first resin receiving unit 17. The resin receiving unit holding mechanism may be hold by using a mechanical structure, hold by using a magnetic force, or hold by using adhesion. The resin receiving unit holding mechanism has a sensor for detecting the presence/absence of the first resin receiving unit 17.

The second resin receiving unit 18 is configured on a second resin receiving unit holding stage 25, and the second resin receiving unit holding stage 25 is equipped with a resin receiving unit holding mechanism (not shown) for the second resin receiving unit 18. The resin receiving unit holding mechanism may hold by using a mechanical structure, hold by using magnetic force, or hold by using adhesion. The resin receiving unit holding mechanism has a sensor for detecting the presence/absence of the first resin receiving unit 17. The second resin receiving unit holding stage 25 is capable of being driven in translational directions for the x, y, z axes of FIG. 1A. An exchange mechanism 19 has a driving unit capable of translation in the x, y, z axes of FIG. 1A and rotation around the Z-axis, and a resin receiving unit holding mechanism (not shown) for holding either the first resin receiving unit 17 or the second resin receiving unit 18. The resin receiving unit holding mechanism may hold by using a mechanical structure, hold by using magnetic force, or hold by using adhesion.

A storage unit 21 has at least two or more slots capable of storing a resin receiving unit. The storage unit 21 has a sensor for detecting the presence/absence of a resin receiving unit for each slot. The storage unit 21 can be accessed from outside the imprint apparatus, so as to exchange the resin receiving unit in the slot. If the first resin receiving unit 17 is exchanged by the exchange mechanism 19, firstly the substrate stage 4 is driven to an exchange position that is accessible by the exchange mechanism 19, and holding by the resin receiving unit holding mechanism of the substrate stage 4 is cancelled. Next, the exchange mechanism 19 is driven to a position at which the exchange mechanism 19 is able to hold the first resin receiving unit 17, and the first resin receiving unit 17 is held by the exchange mechanism 19. Next, the exchange mechanism 19 is driven to a position at which the exchange mechanism 19 is able to transfer the first resin receiving unit 17 to the resin receiving unit storage unit 21, and the first resin receiving unit 17 is transferred to an empty slot of the storage unit 21. Next, the exchange mechanism 19 is driven to a slot of the storage unit 21 at which a first resin receiving unit to be exchanged is stored, and the first resin receiving unit 17 to be exchanged is held by the exchange mechanism 19. Finally, the exchange mechanism 19 is driven to a position at which the first resin receiving unit 17 can be held by the resin receiving unit holding mechanism of the substrate stage 4, and the first resin receiving unit 17 is held by the resin receiving unit holding mechanism of the substrate stage 4. The exchange position for exchanging the first resin receiving unit 17 by using the exchange mechanism 19 is the same as a substrate exchange position for loading or unloading the substrate 3 through the use of a substrate exchange mechanism (not shown), and it is efficient if exchange of the first resin receiving unit 17 is performed in parallel with exchange of the substrate 3. The present invention is not impeded even if exchange of the first resin receiving unit 17 cannot be performed in parallel with exchange of the substrate 3.

If the second resin receiving unit 18 is exchanged by using the exchange mechanism 19, firstly, holding by the resin receiving unit holding mechanism of the second resin receiving unit holding stage 25 is cancelled. Next, the exchange mechanism 19 is driven to a position at which the exchange mechanism 19 is able to hold the second resin receiving unit 18, and the second resin receiving unit 18 is held by the exchange mechanism 19. Next, the exchange mechanism 19 is driven to a position at which the exchange mechanism 19 is able to transfer the second resin receiving unit 18 to the storage unit 21, and the second resin receiving unit 18 is transferred to an empty slot of the storage unit 21. Next, the exchange mechanism 19 is driven to a slot of the storage unit 21 at which a first resin receiving unit to be exchanged is stored, and the second resin receiving unit 18 to be exchanged is held by the exchange mechanism 19. Finally, the exchange mechanism 19 is driven to a position at which it is possible to hold the second resin receiving unit 18 with the resin receiving unit holding mechanism of the second resin receiving unit holding stage 25, and the second resin receiving unit 18 is held by the resin receiving unit holding mechanism of the second resin receiving unit holding stage 25. Exchange of the second resin receiving unit 18 may be executed in parallel with either the imprint process explained through FIGS. 2A to 2F or exchange of the substrate 3. The present invention is not impeded even if exchange of the second resin receiving unit 18 cannot be performed in parallel with exchange of the substrate 3.

After exchanging the resin receiving unit, slot information for the storage unit 21, which has the resin receiving unit that was unloaded, is recorded in a memory unit of the imprint apparatus, whether the resin receiving unit in each slot is unused or used is displayed on the display unit of the imprint apparatus, and furthermore notification is made to a system external to the imprint apparatus. If there is no unused resin receiving unit, a communication for an exchange request is made to outside of the imprint apparatus. When an exchange to an unused resin receiving unit in the storage unit 21 is performed, slot information regarding the exchange is received from outside of the imprint apparatus, and information of the memory unit and the display unit of the imprint apparatus is updated.

Figure 5:
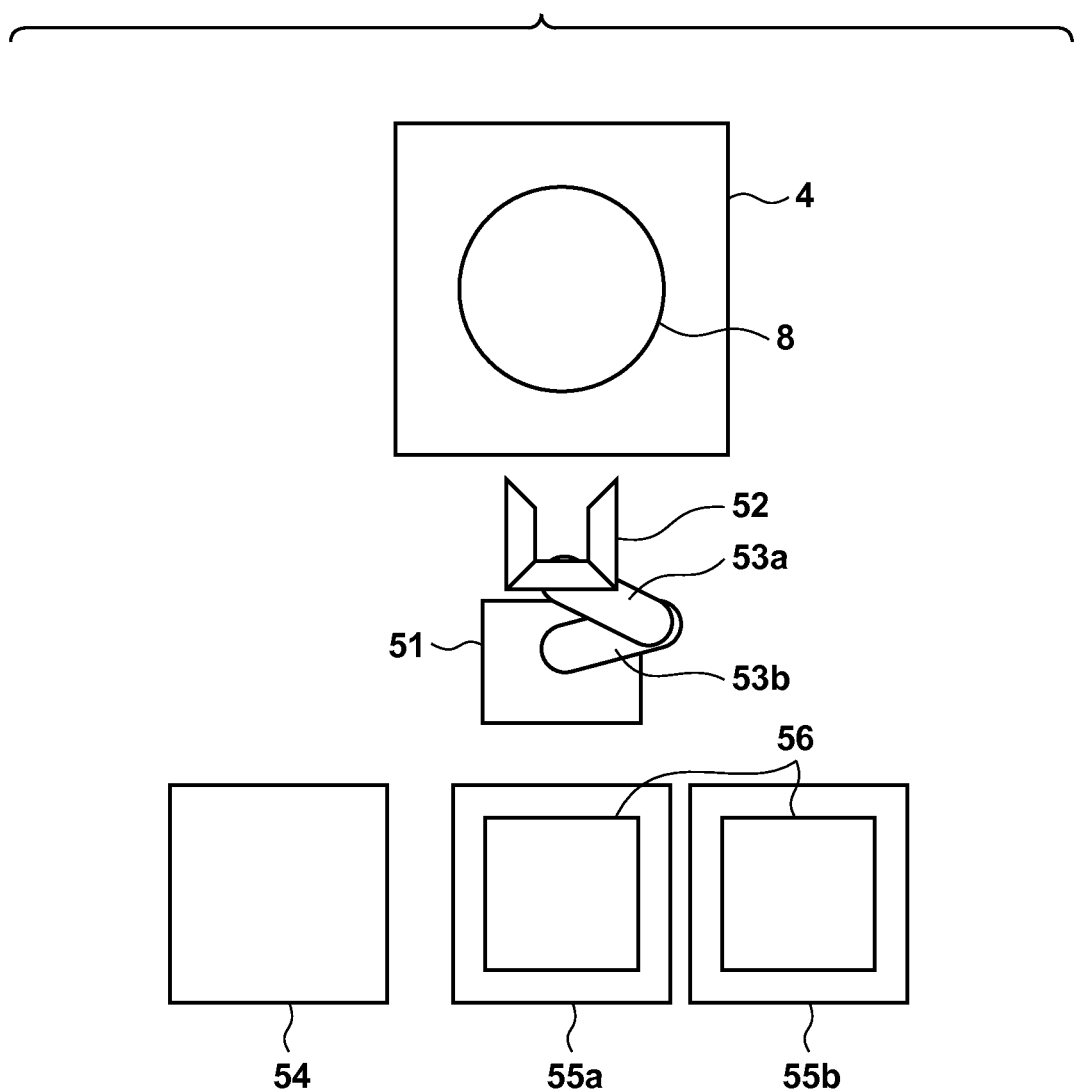
FIG. 5 is a view showing a substrate conveying mechanism.

FIG. 5 shows a substrate exchange mechanism 51. The substrate exchange mechanism 51 can be driven in an upward/downward orientation, and is comprised of a first arm 53a and a second arm 53b that are capable of being driven to decompress and to rotate in a horizontal direction, as well as a substrate conveyance hand 52 capable of rotation in a horizontal direction. A substrate carrier 56 that holds a plurality of the substrate 3 is loaded/unloaded with respect to the first substrate loading and unloading mechanism 55a and the second substrate loading and unloading mechanism 55b. The substrate conveyance hand 52 is capable of loading or unloading the substrate 3 one at a time with respect to any slot of the substrate carrier 56 which is mounted on either the first substrate loading and unloading mechanism 55a or the second substrate loading and unloading mechanism 55b, or any slot of a substrate storage unit 54 or the substrate stage 4. The substrate conveyance hand 52 is equipped with an adhesion mechanism on the upper surface thereof, and can adhere to the substrate 3. The substrate storage unit 54 is equipped with one or more slots, and is able to store one or more dummy substrates on which it is possible to perform dummy dispensing.

The dummy substrate can be formed by silicon, a plastic, gallium arsenide, mercury telluride, and also a compound material of these. The dummy substrate has a shape that can be placed on the substrate stage 4 similarly to the substrate 3 for manufacturing use. The dummy substrate may be spin-coated in advance by a compound liquid for adjusting that includes an additive for lowering surface energy on an upper surface.

Next dummy dispensing will be discussed. Regarding a first dummy dispensing, first the substrate stage 4 is driven so that the first resin receiving unit 17 is arranged on the underside of the coating unit 6. Next, dummy dispensing is performed from the coating unit 6 for only a predetermined number of times. Next, the substrate stage 4 is driven so that the resin 26 dummy dispensed onto the first resin receiving unit 17 is arranged on the underside of the first irradiation unit 5b. Next, the switching mechanism 5d is driven so that irradiation is guided to the first irradiation unit 5b. Finally, a shutter (not shown) of the irradiation unit 5 is driven, and the resin 26 dummy dispensed onto the first resin receiving unit 17 is cured. If a dummy dispensing region is wider than an irradiation region, dummy dispensing is performed to a first dummy dispensing region 43 and a second dummy dispensing region 44 together. Thereafter, the substrate stage 4 may be driven to expose and cure the first dummy dispensing region 43, and then the substrate stage 4 may be driven to irradiate and cure the second dummy dispensing region 44. It may be that after dummy dispensing is performed on the first dummy dispensing region 43, the substrate stage 4 is driven to irradiate and cure the first dummy dispensing region 43, and then after dummy dispensing is performed on the second dummy dispensing region 44, the substrate stage 4 is driven to irradiate and cure the second dummy dispensing region 44. The number of divisions for the dummy dispensing region and the number of times of irradiation are not necessarily limited to two, and may be more than two. Furthermore, it is not necessary for the divided dummy dispensing regions to have a mutually exclusive relationship therebetween.

Regarding a second dummy dispensing, first the coating unit 6 is driven so that the second resin receiving unit 18 is arranged on the underside of the coating unit 6. Next, dummy dispensing is performed from the coating unit 6 for only a designated number of times. Next, the second resin receiving unit holding stage 25 is driven so that the second resin receiving unit 18 is arranged on the underside of the second irradiation unit 5c. Next, the switching mechanism 5d is driven so as the energy beam is guided to the second irradiation unit 5c. Finally, a shutter (not shown) of the irradiation unit 5 is driven, and the resin 26 dummy dispensed onto the second resin receiving unit 18 is cured. When the dummy dispensing region is wider than the irradiation region, processing the same as that for the first dummy dispensing, as previously explained, is performed.

For a third dummy dispensing, firstly, a dummy substrate is loaded from the substrate storage unit 54 to the substrate stage 4. Next, the substrate stage 4 is driven so that the dummy substrate is arranged on the underside of the coating unit 6. Next, dummy dispensing is performed from the coating unit 6 for only a designated number of times. Next, the substrate stage 4 is driven so that the resin 26 dummy dispensed onto the dummy substrate is arranged on the underside of the first irradiation unit 5b. Next, the switching mechanism 5d is driven so that irradiation is guided to the first irradiation unit 5c. Next, a shutter (not shown) of the irradiation unit 5 is driven, and the resin 26 dummy dispensed onto the dummy substrate is cured. Finally, the dummy substrate is unloaded from the substrate stage 4 to the substrate storage unit 54. When the dummy dispensing region is wider than the irradiation region, processing similar to that for the first dummy dispensing, as previously explained, is performed.

Figure 6:
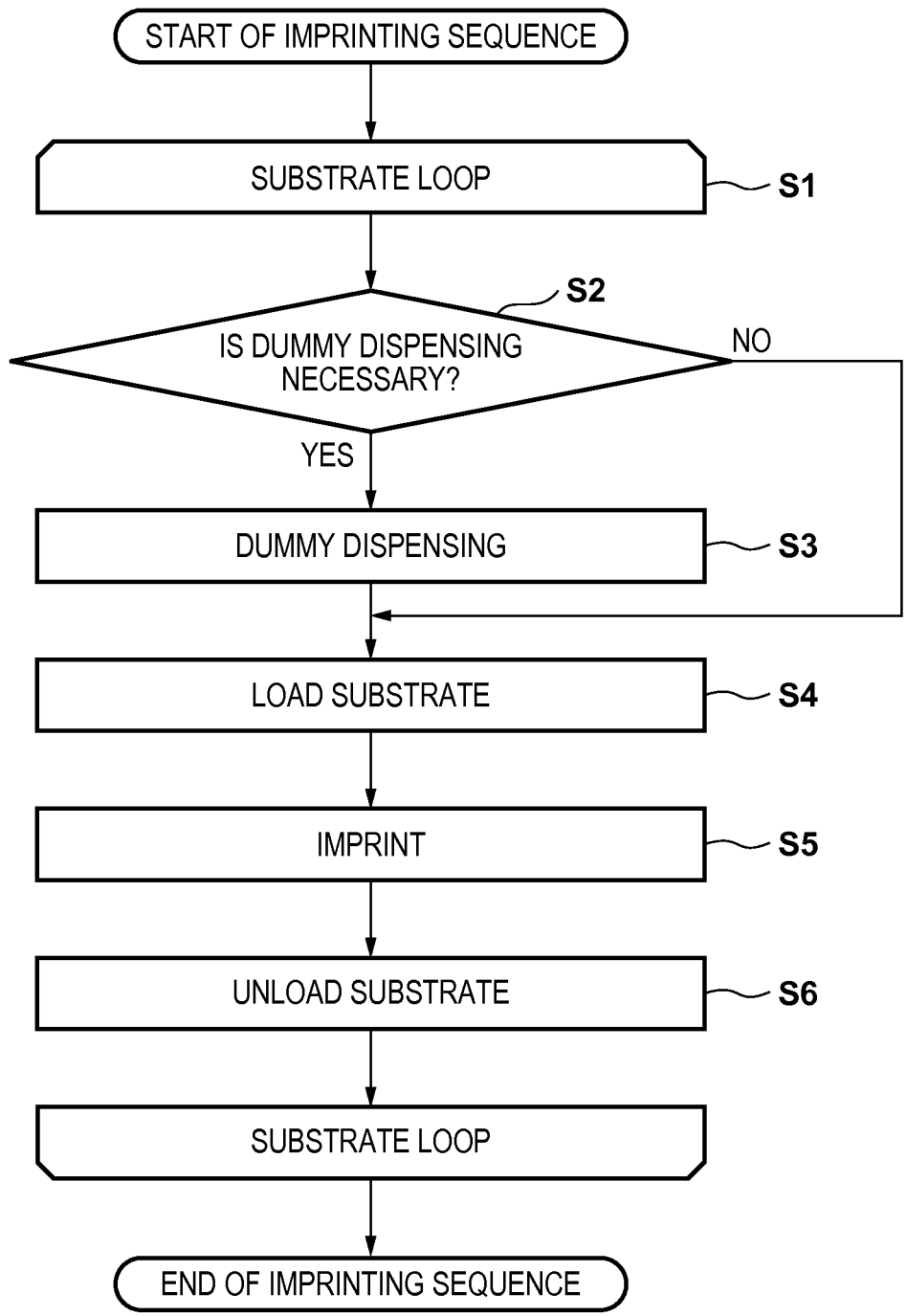
FIG. 6 is a view showing a sequence for the imprint process according to the present invention.

Through FIG. 6, dummy dispensing in an imprint process according to the present invention will be discussed. A controller 60 performs the imprint process, which is explained through FIGS. 2A to 2F with respect to the substrate 3, which is conveyed to the substrate stage 4, in a manufacturing imprint step of step S5. The controller 60 only performs the imprint process for a number of the substrate 3. In a substrate loop of step S1, the controller 60 determines, in step S2, whether dummy dispensing is necessary or not. In step S2, the controller 60 determines whether dummy dispensing is necessary or not based on a first determination criterion or a second determination criterion, which are discussed next. Which of the first determination criterion or the second determination criterion to use is designated before performing the imprint process. With the first determination criterion, if a predetermined interval for the dummy dispensing elapses, the controller 60 determines to perform the next dummy dispensing. With the second determination criterion, when an interval from the previous dummy dispensing at a point in time at which formation of the pattern on the target substrate completes will exceed than a predetermined interval, the controller 60 determines to perform the next dummy dispensing before pattern forming on the target substrate. An interval necessary to process a substrate for manufacturing is determined and designated, before executing the imprint process, based on processing time for loading, imprinting, and unloading a substrate for manufacturing.

In step S3, the controller 60 executes the previously described first to third dummy dispensing. An approach for selecting dummy dispensing is as follows. When the first resin receiving unit 17 and the second resin receiving unit 18 are configured in the imprint apparatus, if the coating unit 6 is in the first position 20a the first dummy dispensing is performed; if the coating unit 6 is in the second position 20b the second dummy dispensing is performed. If the first resin receiving unit 17 is configured in the imprint apparatus and the second resin receiving unit 18 is not configured in the imprint apparatus, the first dummy dispensing is performed. If the first resin receiving unit 17 is not configured in the imprint apparatus and the second resin receiving unit 18 is configured in the imprint apparatus, the second dummy dispensing is performed. Other cases, the third dummy dispensing is performed. Irrespective of which of the first to third dummy dispensing it is, the controller 60 records, in the memory unit of the imprint apparatus, information on a number of times of dummy dispensing and a region in which dummy dispensing is possible for each of the first resin receiving unit 17, the second resin receiving unit 18 and the dummy substrate. The controller 60 determines a region in which dummy dispensing is used from a region in which dummy dispensing is possible of a resin receiving unit or the dummy substrate, and controls a relative position of the coating unit 6 and the first resin receiving unit 17 or the second resin receiving unit 18 or the dummy substrate. After performing dummy dispensing, the controller 60 updates and records in the memory unit the regions in which dummy dispensing is possible after excluding the region used for dummy dispensing from the regions in which dummy dispensing is possible. The controller 60 also updates and records in the memory unit a dummy dispensing time and a dummy dispensing number of times.

If a region in which dummy dispensing is possible in the first resin receiving unit 17 is not more than a reference region or if the number of times of dummy dispensing to the first resin receiving unit 17 is greater than or equal to a reference number of times, the controller 60 determines that it is necessary to exchange the first resin receiving unit. If it is determined that exchange of the first resin receiving unit 17 is necessary, the controller 60 exchanges the first resin receiving unit 17 by using the exchange mechanism 19. If a region in which dummy dispensing is possible for the second resin receiving unit 18 is not more than a reference region or if the number of times of dummy dispensing to the second resin receiving unit 18 is greater than or equal to a reference number of times, the controller 60 determines that it is necessary to exchange the second resin receiving unit. If it is determined that exchange of the second resin receiving unit 18 is necessary, the controller 60 exchanges the second resin receiving unit 18 by using the exchange mechanism 19. If a region in which dummy dispensing is possible for the dummy substrate is not more than a reference region or if the number of times of dummy dispensing to the dummy substrate is greater than or equal to a reference number of times, the controller 60 determines that it is necessary to exchange the dummy substrate. If it is determined that exchange of the dummy substrate is necessary, the controller 60 communicates a request to exchange the dummy substrate in the substrate storage unit 54 to outside of the imprint apparatus.

In step S4, the controller 60 uses the substrate exchange mechanism to load the substrate 3 in the substrate carrier to the substrate holding unit 8. In step S5, the controller 60 performs the imprint process explained through FIGS. 2A to 2F by using a condition designated through a manufacturing recipe. In step S6 the controller 60 uses the substrate exchange mechanism 51 to unload the substrate 3 in the substrate holding unit 8 to the substrate carrier 56.

Next, in dummy dispensing in a standby state of an apparatus according to the present invention, it is determined whether it is necessary to execute dummy dispensing at a fixed interval, and if dummy dispensing is necessary, dummy dispensing is performed by the previously described selection method. Furthermore, if exchange of the first resin receiving unit 17 or the second resin receiving unit 18 is necessary, the exchange is performed in parallel to the loading of the next substrate for manufacturing (step S4). When the standby state of the imprint apparatus continues, the exchange may be performed without waiting for loading of the substrate for manufacturing (step S4).

In the present embodiment, the configuration is such that one of the first to third dummy dispensing can be selected. However, for example, in a configuration of an imprint apparatus not equipped with the second irradiation unit 5c and the second resin receiving unit 18, a configuration may be taken in which it is possible to use the first dummy dispensing or the third dummy dispensing selectively. Furthermore, a configuration may be taken in which the dummy substrate is not configured and only the first dummy dispensing can be used. Alternatively, a configuration may be taken in which it is possible to use the first dummy dispensing or the second dummy dispensing selectively, and only the dummy substrate is not configured. Alternatively, in a configuration of an imprint apparatus not equipped with the first resin receiving unit 17, a configuration may be taken in which it is possible to use the second dummy dispensing or the third dummy dispensing selectively. Alternatively, a configuration may be taken in which only the third dummy dispensing can be used, in a configuration of an imprint apparatus that is not equipped with the first resin receiving unit 17 and the second resin receiving unit 18. By the above, stable pattern forming is made possible because it is possible to remove a volatile component from the resin 26, and thereby prevent adhesion of the volatile component of the resin 26 to a component in the imprint apparatus.

[Article Manufacturing Method]

A method of manufacturing a device (a semiconductor integrated circuit device, a liquid crystal display device, a MEMS, or the like) as an article includes a step of transferring (forming) a pattern to a substrate (a wafer, a glass plate, a film substrate, or the like) by using the previously described imprint apparatus. Furthermore, the method of manufacturing may include a step of etching the substrate onto which the pattern was transferred. Note that when manufacturing other articles, such as patterned media (a storage medium) or an optical element, the method of manufacturing may include another processing step of processing the substrate onto which the pattern was transferred, instead of the etching step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-205201, filed Oct. 3, 2014, which is hereby incorporated by reference herein in its entirety.

What is claimed is:

1. An imprint apparatus for forming a pattern of an imprint material on a substrate by using a mold, the imprint apparatus comprising:
    a substrate stage configured to hold the substrate;
    a dispense unit configured to dispense the imprint material on the substrate;
    an irradiation unit configured to irradiate an energy beam that cures the imprint material;
    a receiving unit configured to receive an imprint material that is dummy dispensed from the dispense unit; and
    a controller configured to cause the dummy dispensed imprint material to be irradiated by an energy beam from the irradiation unit without bringing the dummy dispensed imprint material into contact with the mold.

2. The imprint apparatus according to claim 1,
    wherein the receiving unit includes a first receiving unit that is held at a position on the substrate stage different from a position at which the substrate is held.

3. The imprint apparatus according to claim 1,
    wherein the dispense unit is movable between a first position at which the dispense unit can dispense the imprint material onto the substrate held by the substrate stage, and a second position outside of a movable range of the substrate stage; and
    the receiving unit includes a second receiving unit configured to receive the imprint material dummy dispensed from the dispense unit positioned at the second position.

4. The imprint apparatus according to claim 3,
    wherein the irradiation unit includes a first irradiation unit configured to irradiate an energy beam towards the substrate held by the substrate stage, and a second irradiation unit configured to irradiate an energy beam towards the second receiving unit.

5. The imprint apparatus according to claim 4,
    wherein the irradiation unit includes a single energy beam source and a switching mechanism configured to switch a path for an energy beam generated by the energy beam source between a path for guiding to the first irradiation unit and a path for guiding to the second irradiation unit.

6. The imprint apparatus according to claim 1,
    wherein the receiving unit includes a dummy substrate held in a position at which the substrate stage holds the substrate.

7. The imprint apparatus according to claim 1,
    wherein the controller is configured to control a relative position between the dispense unit and the receiving unit, based on information of a region, in the receiving unit, where the dummy dispensed imprint material can be received.

8. The imprint apparatus according to claim 1,
wherein the controller is configured to exchange the receiving unit, based on information of a number of times of dummy dispensing or information of a region, in the receiving unit, where the dummy dispensed imprint material can be received.

9. The imprint apparatus according to claim 1, further comprising:
a storage unit configured to store the receiving unit.

10. The imprint apparatus according to claim 1,
wherein the controller is configured to perform a next dummy dispensing if a predetermined interval has elapsed from a previous dummy dispensing.

11. The imprint apparatus according to claim 10,
wherein the controller is configured to perform the next dummy dispensing before forming a pattern on a target substrate even if the predetermined interval from the previous dummy dispensing has not elapsed in a case where an interval from the previous dummy dispensing will exceed the predetermined interval at a point in time at which forming of the pattern on the target substrate completes.

12. The imprint apparatus according to claim 1,
wherein the dispense unit includes an ink-jet nozzle.

13. A method of manufacturing an article, the method comprising:
forming a pattern on a substrate by using an imprint apparatus; and
processing the substrate, on which the pattern has been formed, to manufacture the article,
wherein the imprint apparatus comprises:
a substrate stage configured to hold the substrate;
a dispense unit configured to dispense the imprint material on the substrate;
an irradiation unit configured to irradiate an energy beam that cures the imprint material;
a receiving unit configured to receive an imprint material that is dummy dispensed from the dispense unit; and
a controller configured to cause the dummy dispensed imprint material to be irradiated by an energy beam from the irradiation unit without bringing the dummy dispensed imprint material into contact with the mold.

14. An imprint method of forming a pattern of an imprint material on a substrate by bringing the imprint material into contact with a mold, the imprint method comprising:
dummy dispensing the imprint material onto a receiving unit different from the substrate on which the pattern is formed;
forming the pattern of the imprint material on the substrate after the dummy dispensing; and
curing the dummy dispensed imprint material without bringing the dummy dispensed imprint material into contact with the mold, before the pattern forming.

15. An imprint apparatus for forming a pattern of an imprint material on a substrate by using a mold, the imprint apparatus comprising:
a dispense unit configured to dispense the imprint material on the substrate;
a receiving unit different from the substrate on which a pattern is formed and configured to receive the imprint material dummy dispensed from the dispense unit; and
a curing unit configured to cure the imprint material dispensed onto the receiving unit without bringing the imprint material dispensed onto the receiving unit into contact with the mold.

16. An imprint method of forming a pattern of an imprint material on a substrate by using a mold, the imprint method comprising:
dummy dispensing the imprint material onto a receiving unit different from the substrate on which the pattern is formed; and
curing the imprint material dummy dispensed onto the receiving unit.

* * * * *